United States Patent
Paek et al.

(10) Patent No.: US 6,774,023 B1
(45) Date of Patent: *Aug. 10, 2004

(54) METHOD OF MANUFACTURING A SEMICONDUCTOR DEVICE HAVING A MULTILAYER STRUCTURE INCLUDING A DUAL-LAYER SILICIDE

(75) Inventors: Su-Hyon Paek, Seoul (KR); Jin-Seog Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 08/068,708

(22) Filed: May 28, 1993

(30) Foreign Application Priority Data

May 30, 1992 (KR) .......................................... 1992/9414

(51) Int. Cl.[7] .......................................... H01L 21/283
(52) U.S. Cl. .................... 438/592; 438/655; 438/664
(58) Field of Search ................................ 437/200, 193, 437/41 GS, 41 SC; 748/DIG. 19, DIG. 147; 438/585, 592, 655, 664

(56) References Cited

U.S. PATENT DOCUMENTS

| | | | | |
|---|---|---|---|---|
| 4,180,596 A | * | 12/1979 | Crowder et al. ............. | 437/201 |
| 4,285,761 A | * | 8/1981 | Fatula, Jr. et al. ... | 148/DIG. 147 |
| 4,782,380 A | * | 11/1988 | Shankar et al. ............... | 357/71 |
| 4,912,543 A | * | 3/1990 | Neppl et al. ................... | 357/67 |
| 5,103,272 A | * | 4/1992 | Nishiyama ................... | 257/388 |
| 5,194,405 A | * | 3/1993 | Sumi et al. .................. | 437/200 |
| 5,203,957 A | * | 4/1993 | Yoo et al. .................... | 156/643 |

FOREIGN PATENT DOCUMENTS

| | | | |
|---|---|---|---|
| JP | 1-17470 | * | 1/1989 |
| JP | 1-17471 | * | 1/1989 |
| JP | 2-34967 | * | 2/1990 |

OTHER PUBLICATIONS

Wolf et al., Silison Processing, 1986, Lattice Press, vol. 1, pp. 56–58, 175–182, 384–392.*
Fukumoto, et al., "Titanium Silicide Interconnect . . . " IEEE Trans. Elec. Dec. 35(12), Dec. 1988, pp. 2328–2332.*
Brat, et al., "High Purity Titanium Silicide. . . ", in Rapid Thermal Processing of Electronic Materials, Mat. Res. Soc., vol. 92, 1987, Wilson et al. Edited, pp. 191–198.*
Finstad, T., "Silicide Formation Wits Nickel . . . ," Thin Solid Silms, May (1978), pp. 411–424.*
Einspruch, N., ed., VLSI Handbook, Academic Press, 1985, pp. 415–433, Chapter 24, by Nicollet, M.A., et al.*
Wolf, S., Silicon Processing, vol. 2, Lattice Pressing 1996, pp. 144–150.*
Wolf, S., et al., SIlicon Processing, vol. 1, Lattice Press, 1986, pp. 393–405.*
Bajlin, J., et al., "The Formation of Silicide. . . ," J. Electronic Materials, vol. 8, No. 5, 1979, pp. 641–661.*

(List continued on next page.)

*Primary Examiner*—T. N. Quach
(74) *Attorney, Agent, or Firm*—Myers Bigel Sibley & Sajovec

(57) ABSTRACT

A semiconductor device which includes a silicon substrate, an oxide layer formed on the silicon substrate, a polysilicon layer formed on the oxide layer, a first metal silicide layer formed on the polysilicon layer, and a second metal silicide layer formed on the first metal silicide layer, and a method for fabricating the same. The first metal silicide layer is preferably comprised of a metal silicide, such as molybdenum, tungsten, or tantalum silicide, having a melting point which is higher than that of the second metal silicide layer. The second metal silicide layer is preferably comprised of titanium silicide. In an embodiment, the method comprises forming the polysilicon layer on the oxide layer, depositing a tantalum layer on the polysilicon layer, rapidly annealing the resulting structure.

3 Claims, 3 Drawing Sheets

OTHER PUBLICATIONS d'Heurle et al., "Comparison of Annealing . . . ," J. Appl. Phys. 53(4), Apr. 1982, pp. 3067–3069.*

New Silicidation Technology By SITOX (Silicidation Through Oxide) And Its Impact On Sub–Half Micron MOS Devices, by Hirofumi Sumi, Toshiyuki Nishihara, Yukiyasu Sugano, Haruko Masuya and Masao Takasu; Research and Development, Semiconductor Group, SOny COrp. IDEM 90, Dec. 1990, pp. 249–252.

Yoshida, T., "Thermally Stable, Low–Leakage . . .," J. Electrochem. Soc., vol. 137, No. 6, Jun. 1990, pp. 1914–1917.

* cited by examiner

| TEMPERA-TURE (°C) | TIME (MIN) | SHEET RESISTANCE IN CONVENTIONAL TECHNIQUE | SHEET RESISTANCE IN PRESENT THVENTION |
|---|---|---|---|
| 850°C | 30MIN | 2.2 Ω/sq | 3.8 Ω/sq |
| 900°C | 30MIN | 2.3 Ω/sq | 4.2 Ω/sq |
| 950°C | 30MIN | 5.3 Ω/sq | 4.3 Ω/sq |
| 1000°C | 30MIN | 2940 Ω/sq | 5.3 Ω/sq |

METHOD OF MANUFACTURING A SEMICONDUCTOR DEVICE HAVING A MULTILAYER STRUCTURE INCLUDING A DUAL-LAYER SILICIDE

BACKGROUND OF THE INVENTION

The present invention relates to semiconductor devices, and more particularly, to a semiconductor device having a multilayer structure including a dual-layer silicide which has improved high-temperature stability. The multilayer structure can suitably be a polycide gate structure in a dynamic random access memory device (DRAM).

Refractory metal silicides have been widely utilized in applications demanding a gate or wiring material exhibiting low internal resistance. For example, titanium silicide, which is obtained by combining titanium (Ti), which is a refractory metal, with silicon (Si), exhibits excellent electrical conductivity and heat-resistance. Consequently, titanium silicide has found widespread commercial application in VLSI and ULSI processes for fabricating highly-integrated semiconductor memory devices and the like. Because of its remarkable heat-resistance, titanium silicide has particular utility in the fabrication of self-aligned silicide structures (salicides), e.g., such as is disclosed in IEDM 9-12, December, 1990, pp. 249–252.

With reference now to FIGS. 1A, 1B and 1C, successive steps of a conventional process for forming titanium silicide will now be described. With particular reference to FIG. 1A, a silicon dioxide ($SiO_2$) layer 2 is grown to a thickness of approximately 1,000 Å on the upper surface of a monocrystalline silicon substrate 1 whose specific resistance is approximately 5–25 ohms/cm, e.g., by means of a thermal oxidation process carried out at approximately 920° C. Next, a polycrystalline silicon layer 3 is deposited on the upper surface of the silicon dioxide layer 2 to a thickness of approximately 2,500 Å, e.g., by means of a low pressure chemical vapor deposition (LPCVD) process carried out by way of thermally decomposing silane ($SiH_4$) at a temperature of approximately 625° C. in an atmosphere under a pressure of 250 mTorr. Then, phosphorus (P) impurities are ion-implanted into the polycrystalline silicon layer 3, e.g., a phosphorus dose of approximately $5\times10^{15}$ ions/cm$^2$ is ion-implanted with an ion implantation energy of approximately 30 KeV. In order to prevent damage to the upper surface of the polycrystalline silicon layer 3 which may otherwise be caused by the ion implantation process, annealing is carried out in a furnace at approximately 900° C. for about 30 minutes. Thereafter, titanium is deposited, by means of a sputtering process, on the upper surface of the polycrystalline silicon layer 3, to a thickness of approximately 400–600 Å. The resultant structure is then rapidly annealed in a furnace at approximately 800° C., in an argon (Ar) ambient atmosphere, for approximately 20 seconds. This rapid furnace annealing causes the polycrystalline silicon and the titanium of the polycrystalline layer 3 and the titanium layer 4, respectively, to chemically react with each other, thereby resulting in the formation of the titanium silicide layer 5 shown in FIG. 1B.

Above a respective silicon-forming temperature any refractory metal silicide film formed on underlying silicon begins to exhibit a high-temperature instability with metal atoms diffusing from the silicide film into the underlying silicon, so that silicon precipitates into the metal silicide film, the high-temperature instability temperature for any particular refractory metal silicide being known to be closely approximated by multiplying the absolute temperature of the melting point of the particular silicide by a factor of 0.6.

The melting point of titanium silicide is approximately 1540° C. (1813° K.), and its high-temperature instability theoretically begins at 814° C., which is approximately 0.60× its melting point, in terms of absolute temperature (i.e., ° K.). However, the melting point of titanium silicide varies slightly depending upon the particular processing parameters employed in its processing, but generally, its high-temperature instability begins at approximately 900° C.

Consequently, when the resultant multilayer structure including the titanium silicide layer 5 is subjected to temperatures in excess of 900° C. during a subsequent annealing step, the high-temperature instability of the titanium silicide causes problems such as grain growth, plastic deformation, and agglomeration, which induce discontinuites in the thin titanium silicide layer 5. These discontinuities are manifested as microscopic islands 6, as can be seen in FIG. 1C, thereby exposing portions of the upper surface of the silicon layer 3, which has the effect of significantly increasing the internal resistance of the titanium silicide layer 5.

Based on the above, it can be appreciated that there presently exists a need in the art for a multilayer structure including a silicide which eliminates the above-described shortcomings and disadvantages of the prior art. The present invention fulfills this need.

SUMMARY OF THE INVENTION

The present invention encompasses a semiconductor device which includes a silicon substrate, an oxide layer formed on the silicon substrate, a polysilicon layer formed on the oxide layer, a first metal silicide layer formed on the polysilicon layer, and a second metal silicide layer formed on the first metal silicide layer, and a method for fabricating the same. The first metal silicide layer is preferably comprised of a metal silicide, such as tungsten, molybdenum, or tantalum silicide, having a melting point which is higher than that of the second metal silicide layer. The second metal silicide layer is preferably comprised of titanium silicide. A multi-layer structure including a dual-layered silicide as described above avoids the prior art problems of agglomeration, grain growth, and plastic deformation of the silicide due to epitaxial growth of silicon, thus significantly decreasing its sheet resistance and improving its high-temperature stability.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

Figure 1C:
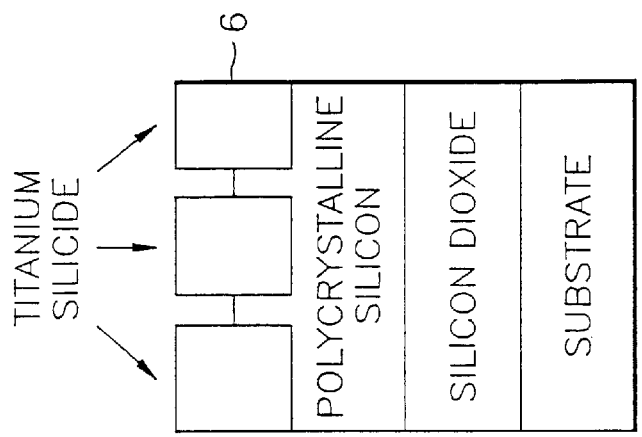
FIGS. 1A–1C are sectional views which depict successive steps of a conventional process for forming a multi-layer structure including a single-layer silicide.
Figure 1B:
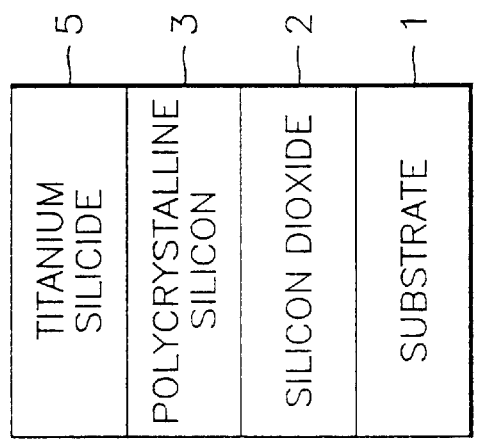
Figure 1A:
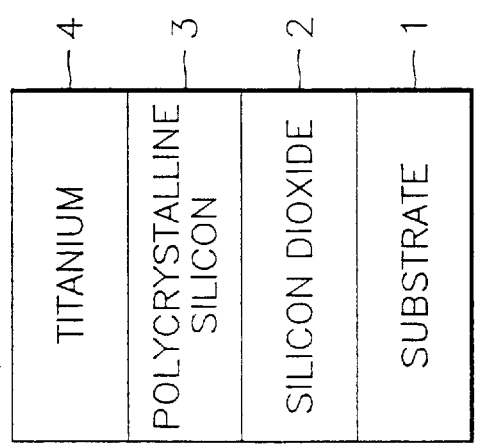
Figure 2A:
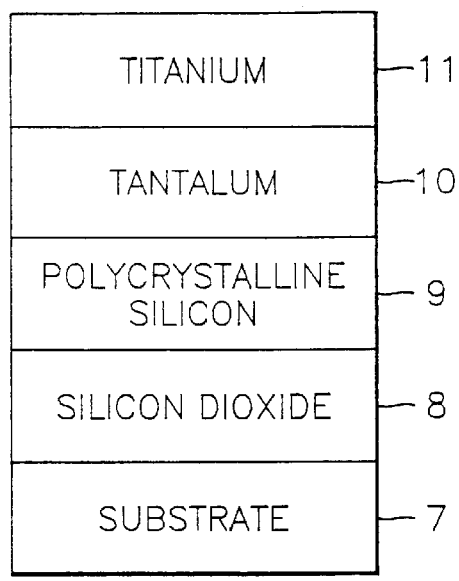
FIGS. 2A–2B are sectional views depicting successive steps of a process for forming a multi-layer structure including a dual-layer silicide, in accordance with a first preferred embodiment of the present invention.
Figure 2B:
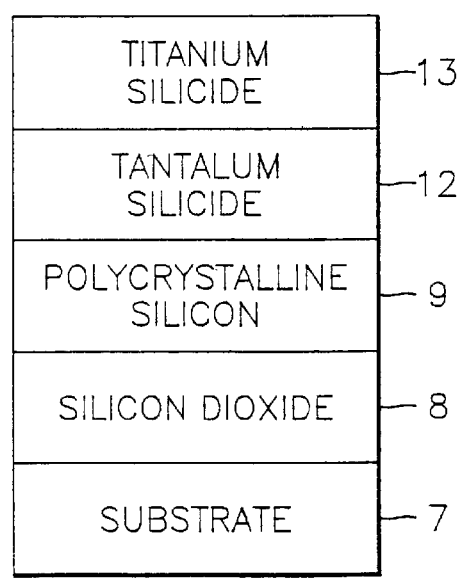

With reference now to FIGS. 2A–2B, a process for fabricating a dual-layer silicide in accordance with a first preferred embodiment of the present invention will now be described. More particularly, with particular reference now to FIG. 2A, a silicon dioxide ($SiO_2$) layer 8 is grown to a thickness of approximately 1,000 Å on a monocrystalline silicon substrate 7 whose specific resistance is approximately 5–25 ohms/cm, e.g., by means of a thermal oxidation process carried out at 920° C. Next, a polycrystalline silicon layer 9 is deposited to a thickness of approximately 2,500 Å on the upper surface of the silicon dioxide layer 8, e.g., by means of a low-pressure chemical vapor deposition (LPCVD) process. Conveniently, the LPCVD process is carried out by thermally decomposing silane ($SiH_4$) at a temperature of approximately 625° C. in an atmosphere under a pressure of 250 mTorr. Then, phosphorus (P) impurities are ion-implanted into the polycrystalline silicon layer 9, e.g., a phosphorus dose of approximately $5 \times 10^{15}$ ions/cm$^2$ is ion-implanted with an ion-implantation energy of approximately 30 KeV. In order to prevent damage to the upper surface of the polysilicon layer 9 which may otherwise be caused by the ion implantation process, the polysilicon layer is preferably etched with a buffered HF solution obtained by dissolving hydrofluoride (HF) in water at a ratio of 1:100.

Next, a tantalum layer 10 is deposited on the upper surface of the polycrystalline silicon layer 9 to a thickness of approximately 100–200 Å, e.g., by means of a sputtering process. Then, a titanium layer 11 is deposited on the upper surface of the tantalum layer 10 to a thickness of approximately 400–600 Å, e.g., by means of a sputtering process. The resultant structure is then rapidly annealed in a furnace at approximately 800° C., in an argon (Ar) ambient atmosphere, for approximately 20 seconds. This rapid furnace annealing causes the polycrystalline silicon and the tantalum of the polysilicon layer 9 and the tantalum layer 10, respectively, to chemically react with each other, thereby resulting in the formation of the tantalum silicide ($TaSi_2$) layer 12, and further, causes the polycrystalline silicon and the titanium of the polysilicon layer 9 and the titanium layer 11, respectively, to chemically react, thereby resulting in the formation of the titanium silicide ($TiSi_2$) layer 13, as can be seen in FIG. 2B.

Figures 3A, 3B, 4:
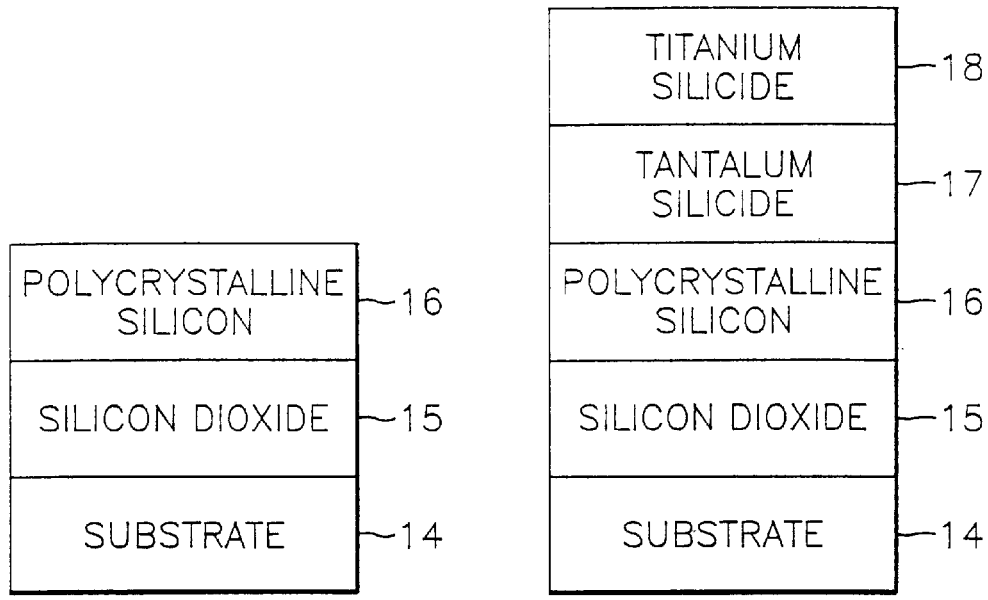
FIGS. 3A–3B are sectional views depicting successive steps of a process for forming a multi-layer structure including a dual-layer silicide, in accordance with a second preferred embodiment of the present invention; and, FIG. 4 is a table comparing the sheet resistance of a single-layer silicide obtained by the conventional process and the sheet resistance of a dual-layer silicide obtained by the process of the present invention.

With reference now to FIGS. 3A–3B, a process for fabricating a dual-layer silicide in accordance with a second preferred embodiment of the present invention will now be described. More particularly, with particular reference now to FIG. 3A, a silicon dioxide layer 15 is grown to a thickness of approximately 1,000 Å on a monocrystalline silicon substrate 14 whose specific resistance is approximately 5–25 ohms/cm, e.g., by means of a thermal oxidation process carried out at 920° C. Next, a polycrystalline silicon layer 16 is deposited to a thickness of approximately 2,500 Å on the upper surface of the silicon dioxide layer 15, e.g., by means of a low-pressure chemical vapor deposition (LPCVD) process. Conveniently, the LPCVD process is carried out by thermally decomposing silane ($SiH_4$) at a temperature of approximately 625° C. in an atmosphere under a pressure of approximately 250 mTorr. Then, phosphorus (P) impurities are ion-implanted into the polycrystalline silicon layer 16, e.g., a phosphorus dose of approximately $5 \times 10^{15}$ ions/cm$^2$ is ion-implanted with an ion implantation energy of approximately 30 KeV. In order to prevent damage to the upper surface of the polysilicon layer 16 which may otherwise be caused by the ion implantation process, the polysilicon layer is preferably etched with a buffered HF solution obtained by dissolving hydrofluoride (HF) in water at a ratio of 1:100.

With particular reference now to FIG. 3B, a tantalum silicide layer 17 is then deposited on the upper surface of the polysilicon layer 16 to a thickness of approximately 200–400 Å, by means of a sputtering method, using a composite target comprised of tantalum silicide. Next, a titanium silicide layer 18 is deposited on the upper surface of the tantalum silicide layer 17 to a thickness of approximately 800–1,200 Å, by means of a sputtering method, using a composite target comprised of titanium silicide. The resultant structure is then rapidly annealed in a furnace at approximately 800° C., in an argon (Ar) ambient atmosphere, for approximately 20 seconds. This rapid furnace annealing converts to crystalline form an amorphous double-layered silicide comprised of titanium silicide and tantalum silicide, as can be seen in FIG. 3B.

The melting point of tantalum silicide is 2,200° C. (2,473° K.). Thus, its high-temperature instability begins at 1,210.8° C., which is much greater than the temperature (814° C.) that titanium silicide begins to become unstable. Therefore, because the melting point of tantalum silicide is higher than that of titanium silicide, the double-layered silicide comprised of the titanium silicide layer 18 and the tantalum silicide layer 17 overcomes the prior art problems of grain growth, plastic deformation, and agglomeration caused by the epitaxial growth of silicon. In other words, since the tantalum silicide layer 17 interfaces with the polysilicon layer 16, rather than the titanium silicide layer 18 interfacing with the polysilicon layer 16, as in the prior art, epitaxial growth of the silicon is inhibited, due to the fact that the temperature at which the tantalum silicide begins to become unstable is higher than the subsequent process temperatures (900°–1,200° C.) to which it will be exposed, whereas the temperature at which titanium silicide begins to become unstable is lower than the subsequent process temperatures.

The high-temperature stability of the double-layered silicide obtained by the process of the present invention has been measured and compared with that of the titanium silicide obtained by the conventional process, with the results being illustrated in FIG. 4. More particularly, the table depicted in FIG. 4 was derived by annealing the double-layered silicide obtained by the process of the present invention and the silicide layer produced by the conventional technique, in a furnace, in a nitrogen ($N_2$) ambient atmosphere, for 30 minutes, at 850° C., 900° C., 950° C., and 1,000° C., respectively. As can be appreciated from FIG. 4, in the case of the titanium silicide obtained by the conventional technique, agglomeration of the titanium silicide begins at 950° C., thereby significantly increasing the sheet resistance thereof. For example, the sheet resistance is 2.2 ohms/sq at 850° C., but is 5.3 ohms/sq at 950° C. Moreover, the sheet resistance is very high (2,940 ohms/sq) at 1,000° C. However, in the case of the double-layered silicide obtained by the process of the present invention, it can be seen that the increase of its sheet resistance as a function of temperature is relatively insignificant, e.g., the sheet resistance at 1,000° C. is 5.3 ohms/sq as compared with 3.8 ohms/sq at 850° C.

Although tantalum silicide is employed as the lower silicide layer in the above-described preferred embodiments of the present invention, it should be clearly understood that this is not limiting to the present invention. Alternatively, the lower silicide layer can conveniently be comprised of molybdenum, tungsten, or any other suitable metal which silicide has a higher melting point (and, accordingly, a higher high-temperature instability temperature in proportion thereto) than that of the titanium silicide used as the upper silicide layer. In this connection, the melting point of tungsten silicide is 2,165° C. (2,438° K.), and the melting point of molybdenum silicide is 1,980° C. (2,253° K.). Therefore, the high-temperature instability of tungsten silicide begins at 1,462.8° K. (1,189.8° C.), and the high-temperature instability of molybdenum silicide begins at 1,351.8° K. (1,078.8° C.). Obviously, these temperatures are much higher than the temperature at which titanium silicide begins to become unstable. Therefore, when the lower silicide layer is comprised of either tungsten silicide or molybdenum silicide, the prior art problems of agglomeration, plastic deformation, and grain growth are eliminated during a subsequent process step carried out in a furnace at a temperature of 900° C. or higher.

Although several preferred and alternative embodiments of the present invention have been described hereinabove, it should be clearly understood that many variations and/or modifications of the basic inventive concepts herein taught which may appear to those skilled in the pertinent art will still fall within the spirit and scope of the present invention, as defined in the appended claims.

What is claimed is:

1. A method for fabricating a continuous layer of titanium silicide with prescribed sheet resistance essentially throughout on the surface of a polycrystalline silicon layer formed on an oxide layer within a semiconductor device, said titanium silicide exhibiting high-temperature instability only above 814° C., said method comprising the successive steps of:

forming said oxide layer on a substrate;

forming said polycrystalline silicon layer on said oxide layer;

depositing a layer of tantalum on said polycrystalline silicon layer;

depositing a layer of titanium on said layer of tantalum;

rapidly annealing the structure resulting from the foregoing steps at temperature below 814° C., long enough to result in the conversion of said layer of tantalum to a layer of tantalum silicide and to result in the conversion of said layer of titanium to a layer of titanium silicide; and thereafter purposely subjecting the structure resulting from said annealing for at least several minutes to elevated temperature above 814° C., said layer of tantalum silicide forestalling the occurrence of discontinuities in said layer of titanium silicide owing to said elevated temperature, which discontinuities would occur if said layer of titanium silicide directly adjoined said polycrystalline silicon layer and would raise said sheet resistance undesirably above said prescribed value.

2. The method set forth in claim 1, wherein said substrate is monocrystalline silicon.

3. The method set forth in claim 1, wherein said elevated temperature is at least 950° C.

* * * * *